(12) United States Patent
Sun et al.

(10) Patent No.: US 7,304,295 B2
(45) Date of Patent: Dec. 4, 2007

(54) METHOD AND SYSTEM OF DETECTING ECCENTRICITY AND UP/DOWN MOVEMENT OF A CODE WHEEL OF AN OPTICAL ENCODER SET

(75) Inventors: Cheah Chiang Sun, Bagan Lallang (MY); Yeoh Chin Heong, Berapit (MY); Tai Li Chong, Jalan Batu Uban (MY)

(73) Assignee: Avago Technologies ECBUIP (Singapore) Pte Ltd, Singapore (SG)

( * ) Notice: Subject to any disclaimer, the term of this patent is extended or adjusted under 35 U.S.C. 154(b) by 0 days.

(21) Appl. No.: 11/240,934

(22) Filed: Sep. 30, 2005

(65) Prior Publication Data

US 2007/0075230 A1    Apr. 5, 2007

(51) Int. Cl.
*G01D 5/34* (2006.01)

(52) U.S. Cl. .............. 250/231.14; 250/231.13; 250/231.18; 356/616; 356/617

(58) Field of Classification Search ................
250/231.13–231.18, 237 G, 237 R; 356/616–617;
33/1 PT, 1 N, 1 L; 341/11, 13
See application file for complete search history.

(56) References Cited

U.S. PATENT DOCUMENTS

| | | | | |
|---|---|---|---|---|
| 4,580,047 | A * | 4/1986 | Sasaki et al. | 250/231.16 |
| 4,883,955 | A * | 11/1989 | Kawasaki et al. | 250/231.16 |
| 5,291,026 | A * | 3/1994 | Morokuma | 250/237 G |
| 5,774,074 | A * | 6/1998 | Cooper et al. | 341/11 |
| 5,900,930 | A * | 5/1999 | Simon et al. | 356/138 |
| 6,084,234 | A * | 7/2000 | Stridsberg | 250/231.16 |
| 6,639,207 | B2 * | 10/2003 | Yamamoto et al. | 250/231.14 |
| 6,774,355 | B2 * | 8/2004 | Kudo | 250/231.13 |
| 7,019,282 | B2 * | 3/2006 | Atsuta et al. | 250/231.16 |
| 7,187,305 | B2 * | 3/2007 | Ellis et al. | 250/231.13 |
| 2005/0098715 | A1 * | 5/2005 | Kataoka | 250/231.13 |
| 2006/0061489 | A1 * | 3/2006 | Ellis et al. | 341/13 |
| 2006/0243895 | A1 * | 11/2006 | Nordenfelt et al. | 250/231.13 |

FOREIGN PATENT DOCUMENTS

| | | |
|---|---|---|
| JP | 2001-264119 | 9/2001 |
| JP | 2002-257595 | 9/2002 |
| WO | WO 01/46644 A1 | 6/2001 |
| WO | WO 2006/034389 A1 | 3/2006 |

OTHER PUBLICATIONS

UK Search Report dated Nov. 10, 2006 involving UK counterpart application No. GB0619290.0.

* cited by examiner

*Primary Examiner*—Davienne Monbleau

(57) ABSTRACT

A system and method of measuring a rotational motion of a code wheel measures a rotational movement of the code wheel including an error component due to a non-rotational movement of the code wheel; measures the non-rotational movement of the code wheel; and produces an error-corrected measurement of the rotational movement of the code wheel by using the measured non-rotational movement of the code wheel to cancel the error component of the measured rotational movement of the code wheel. A signal can be produced indicating a need for maintenance when the non-rotational movement of the code wheel exceeds a threshold.

11 Claims, 6 Drawing Sheets

METHOD AND SYSTEM OF DETECTING ECCENTRICITY AND UP/DOWN MOVEMENT OF A CODE WHEEL OF AN OPTICAL ENCODER SET

BACKGROUND

Optical encoders are used in a wide variety of contexts to determine movement and/or a position of an object with respect to some reference. Optical encoding is often used in mechanical systems as an inexpensive and reliable way to measure and track motion among moving components. For instance, printers, scanners, photocopiers, fax machines, plotters, and other imaging systems often use optical encoding to track the movement of an image media, such as paper, as an image is printed on the media or an image is scanned from the media.

One common technique for motion encoding uses an optical encoder and an encoder pattern (or encoding media). The optical encoder focuses light on a surface of the encoder pattern. As the encoder pattern (or encoding media) moves with respect to the optical encoder, an optical sensor reads a pattern of light either transmitted through, or reflected by, the encoder pattern to detect the motion.

A typical encoder pattern is an alternating series of features. As the encoder pattern moves relative to the optical encoder (or vice versa), transitions from one feature to the next in the pattern are optically detected. For instance, an encoder pattern could be an alternating pattern of holes, or optically transmissive windows, in an opaque material. In that case, an optical sensor can detect transitions from darkness to light passing through the holes or windows.

FIG. 1 illustrates a basic motion encoder set 100 comprising: an optical encoder 110 including a light emitter 112 and an optical sensor 114; a housing 175 on which optical encoder 110 is mounted; a rotating shaft 150; and a code wheel 130 including an encoder pattern 132 disposed between the light emitter 112 and the optical sensor 114, mounted on the rotating shaft 150. Code wheel 130 rotates, thereby moving encoder pattern 132 relative to optical encoder 110.

In the embodiment of FIG. 1, optical encoder 110 operates in a transmissive mode by detecting light passed through encoder pattern 132 of code wheel 130. In another embodiment, light emitter 112 and optical sensor 114 could be disposed on the same side of code wheel 130 such that optical encoder 110 operates in a reflective mode by detecting light reflected by encoder pattern 132 of code wheel 130.

In one embodiment, encoder pattern 132 is an A/B pattern having alternating areas of differing optical transmissivity or reflectivity, depending on the design of optical encoder 110. Optical sensor 114 detects the rate of change between the A and B patterns and thereby ascertains the relative rotational movement between encoder pattern 132 and optical encoder 110.

However, due to wear and tear of code wheel 130 or shaft 150, or perhaps a bearing of shaft 150, the edge of code wheel 130 may eventually begin moving eccentrically (waggling and/or wobbling), and/or moving up and down within the encoder housing 175. If there is a waggling eccentricity in code wheel 150's motion, optical encoder 110 will not encode the rotational movement accurately, especially when the movement is less than one full revolution. Also, a wobbling code wheel 130, or an up/down movement of code wheel 130, may rub against or collide with housing 175, producing inaccurate motion detection signal(s) and possibly damaging housing 175 and/or code wheel 130.

In many cases, a motion encoder set is located internal to some host apparatus so that a waggling or wobbling code wheel, or a code wheel moving up and down in the encoder housing, is not easily observed and recognized. So, a user has no way of determining the magnitude of any waggling or up/down movement of the code wheel or shaft. Therefore, the user may not recognize that the motion encoder set is providing inaccurate signals which may impair operation of the host apparatus, or even damage the host apparatus, or that the motion encoder set itself can be damaged.

To address this problem, currently it is required that preventive maintenance be performed periodically on the optical encoder set to inspect for eccentric and/or up/down movement, and to make any necessary repairs and parts replacement. In many cases, this requires the host apparatus to be shut down and opened for inspection. As a result, this periodic maintenance is very expensive, and increases the down-time of the host apparatus. Furthermore, in many cases the maintenance is performed unnecessarily when there is no code wheel eccentricity or up/down movement, and the motion encoder set is performing perfectly.

What is needed, therefore is a motion encoder set that overcomes at least the shortcomings of known motion encoder sets.

SUMMARY

In an example embodiment, a motion encoder set comprises: a code wheel, including, provided thereon, a first encoder pattern, and a second encoder pattern; a first optical encoder, including a first light source adapted to provide light to the first encoder pattern and a first optical sensor adapted to receive the light from the first encoder pattern and in response thereto to output one or more signals indicating a rotational movement of the code wheel; and a second optical encoder, including a second light source adapted to provide light to the second encoder pattern and a second optical sensor adapted to receive the light from the second encoder pattern and in response thereto to output one or more signals indicating a non-rotational movement of the code wheel.

In another example embodiment, a method of determining a motion of a code wheel, comprising: providing light to a first encoder pattern provided on the code wheel; receiving the light from the first encoder pattern and in response thereto outputting one or more signals indicating a rotational movement of the code wheel; providing light to a second encoder pattern provided on the code wheel; and receiving the light from the second encoder pattern and in response thereto outputting one or more signals indicating a non-rotational movement of the code wheel.

In yet another example embodiment, a method of measuring a rotational motion of a code wheel comprises: measuring a rotational movement of the code wheel including an error component due to a non-rotational movement of the code wheel; measuring the non-rotational movement of the code wheel; and producing an error-corrected measurement of the rotational movement of the code wheel by using the measured non-rotational movement of the code wheel to cancel the error component of the measured rotational movement of the code wheel.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
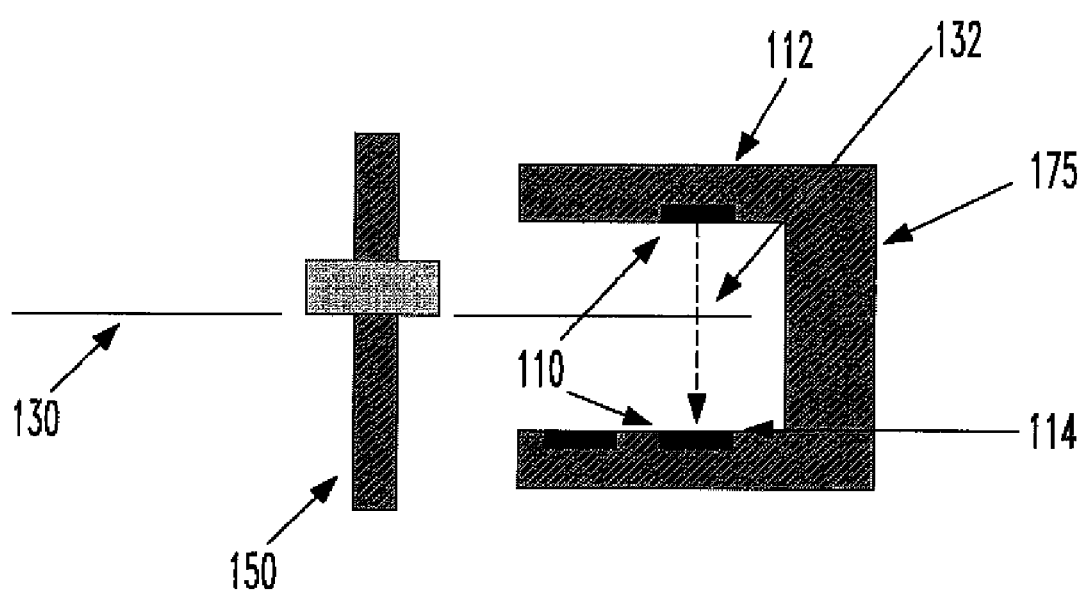
FIG. 1 shows a basic motion encoder set.
Figure 2:
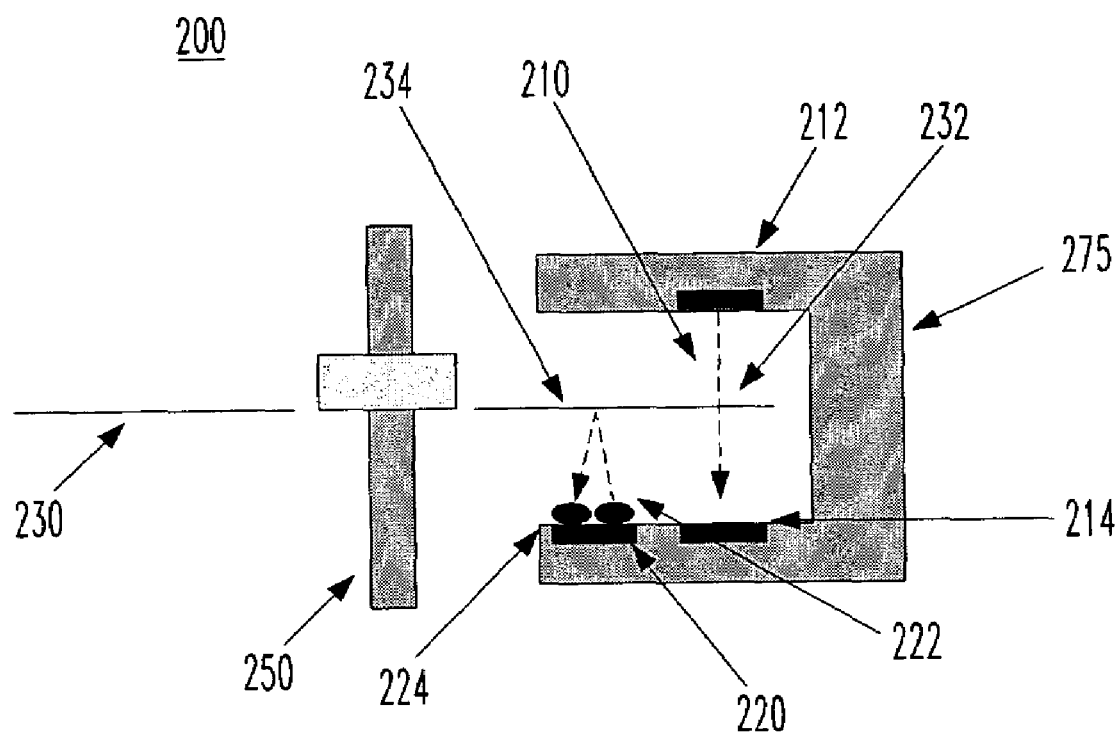
FIG. 2 shows one embodiment of a self duty error correcting motion encoder set.

FIG. 2 shows an example embodiment of a self duty error correcting motion encoder set 200, comprising: a first optical encoder 210 including a first light emitter 212 and a first optical sensor 214; a second optical encoder 220 including a second light emitter 222 and a second optical sensor 224; a housing 275 on which first and second optical encoders 210, 220 are mounted; a rotating shaft 250; and a code wheel 230 mounted on shaft 250, the code wheel 230 including a first encoder pattern 232 and a second encoder pattern 234 disposed thereon, such that first encoder pattern 232 is disposed between first light emitter 212 and first optical sensor 214. Code wheel 230 rotates along with shaft 250, thereby moving first encoder pattern 232 relative to first optical encoder 210, and second encoder pattern 234 relative to second optical encoder 220.

In the embodiment shown in FIGS. 2-5, for the sake of simplifying the explanation, code wheel 230 is shown comprising a single disk, with first encoder pattern 232 and second encoder pattern 234 disposed on one or both planar surfaces thereof. However, it should be understood that code wheel set 230 could instead comprise two or more separate disks rotating on the rotating shaft 250, with first encoder pattern 232 disposed on one disk, and second encoder pattern 234 disposed on a different, separate, disk.

Furthermore, in the embodiment shown in FIGS. 2-5, for the sake of simplifying the explanation, first and second optical encoders 210, 220 are shown mounted on common housing 275. However, it should be understood that first and second optical encoders 210, 220 can be packaged separately, being mounted on two separate housings 275.

Turning again to FIG. 2, as will be explained in further detail below, first optical encoder 210 operates in conjunction with first encoder pattern 232 to measure a rotational movement of code wheel 230 and to output one or more signals indicating the rotational movement of code wheel 230. That is, first motion detector 210 outputs one or more signals having first coding information indicating a rotational speed of shaft 250 on which code wheel 230 is mounted. In contrast, second optical encoder 220 operates in conjunction with second encoder pattern 234 to measure a non-rotational movement of code wheel 230 and to output one or more signals indicating the non-rotational movement of code wheel 230. In particular, second optical encoder 220 operates in conjunction with second encoder pattern 234 to measure an eccentric movement of code wheel 230, specifically a waggling movement.

In the embodiment of FIG. 2, first optical encoder 210 operates in a transmissive mode by detecting light passed through first encoder pattern 232 of code wheel 230, while second optical encoder 220 operates in a reflective mode by detecting light reflected by second encoder pattern 234. However, any combination of optical encoders operating in the transmissive and reflective modes is possible. For example, in another embodiment, first light emitter 212 and first optical sensor 214 could be disposed on the same side of code wheel 230 such that first optical encoder 210 operates in a reflective mode by detecting light reflected by first encoder pattern 232 of code wheel 230.

Figure 3:
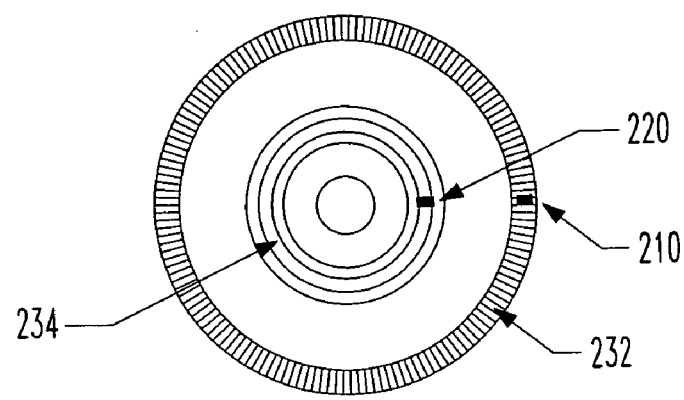
FIG. 3 shows a bottom view of a code wheel of a self duty error correcting motion encoder set.

FIG. 3 shows a bottom view of one embodiment of code wheel 230 that may be used in self duty error correcting motion encoder set 200. As shown in FIG. 3, code wheel 230 comprises a single disk and includes on one or both planar surfaces thereof first encoder pattern 232 and second encoder pattern 234. In the embodiment of FIG. 3, first encoder pattern 232 is a transmissive encoder pattern, and second encoder pattern 234 is a reflective pattern. First encoder pattern 232 codes information for rotational motion detection, and second encoder pattern 234 codes information for non-rotational motion detection.

In the embodiment of FIG. 3, first encoder pattern 232 is an A/B pattern having alternating areas of differing optical transmissivity or reflectivity, depending on the design of first optical encoder 210. In that case, optical sensor 214 can detect the rate of change between the A and B patterns and thereby ascertain the relative rotational movement between first optical encoder 210 and encoder pattern 232.

Meanwhile, in the embodiment of FIG. 3, second encoder pattern 234 is an alternating pattern of annular rings of differing optical reflectivity, depending on the design of second optical encoder 220 with which it us used. Optical sensor 224 follows a different annular ring of second encoder pattern 234 depending upon the relative in-and-out position of code wheel 230 with respect to second optical encoder 220, for example due to a waggling or eccentric motion of code wheel 230.

Figure 4:
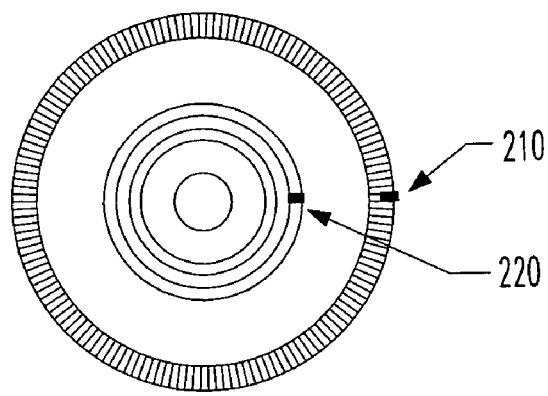
FIG. 4 illustrates a bottom view of a code wheel of a self duty error correcting motion encoder set when the shaft on which the code wheel is mounted is disposed slightly further away than a nominal position with respect to an optical encoder, due to eccentric movement of the code wheel.
Figure 5:
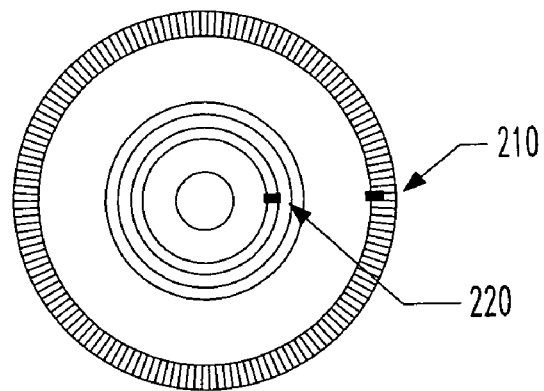
FIG. 5 illustrates a bottom view of a code wheel of a self duty error correcting motion encoder set when the shaft on which the code wheel is mounted is disposed slightly closer than a nominal position with respect to an optical encoder, due to eccentric movement of the code wheel.

An explanation of the operation of self duty error correcting motion encoder set 200 will now be provided with reference to FIGS. 4 and 5.

FIG. 4 illustrates a bottom view of code wheel 230 of self duty error correcting motion encoder set 200 when shaft 250 is disposed slightly further away than a nominal position with respect to first optical encoder 210, due to a waggling or eccentric movement of code wheel 230 and shaft 250. More specifically, in the case illustrated in FIG. 4 due to waggling of shaft 250, code wheel 230 is moved eccentrically in such a way that first optical encoder 210 transmits light through an outer edge of first encoder pattern 232 on the planar surface of code wheel 230, rather than through a nominal position in first encoder pattern 232.

In this case, the duty of pulses reported out of first optical encoder 210 in one or more output signals reflects a revolution of more than 180° because first optical encoder 210 is reading information at the outer edge of first encoder pattern 232. At this time, second optical encoder 220 will report the magnitude of the eccentricity movement of code wheel 230 based on how many annular rings of second encoder pattern 234 it has moved outward from its initial reading. That is, if second optical encoder 220 is initially reading the central annular ring of second encoder pattern 234, then due to the eccentric movement of shaft 250 and code wheel 230 it will start to read a different angular ring that is outside the central annular ring. In that case, second optical encoder 220 will report an eccentric movement of +1, +2, etc. depending on which annular ring it reads, which in turn depends on the magnitude of the eccentricity of the movement of code wheel 230.

The information from second optical encoder 220 can be used to correct for a duty cycle error of first optical encoder 210. Correction can be done using a simple interpolation method. For example, if code wheel 230 will give a maximum of +X° duty cycle (before it is out of coding range) at Y counts of eccentricity magnitude, then the self duty error correction would be:

$$\text{Error} = (X° - 180°)*(N/Y), \quad 1)$$

where N is the eccentricity number (+1, +2, etc.) reported out of second encoder 220.

Meanwhile, when there is no eccentricity in the movement of shaft 250 and code wheel 230, then there is no change in the annular ring of second encoder pattern 234 which is followed by second optical encoder 220, and accordingly second optical encoder 234 does not produce any signal indicating any eccentric movement by code wheel 230.

FIG. 5 illustrates a bottom view of code wheel 230 of self duty error correcting motion encoder set 200 when shaft 250 is disposed slightly closer than a nominal position with respect to first optical encoder 210, due to eccentric (e.g., waggling) movement of code wheel 230 and shaft 250. More specifically, in the case illustrated in FIG. 5 due to eccentric movement of shaft 250, code wheel 230 is moved eccentrically in such a way that first optical encoder 210 transmits light through an inner edge of first encoder pattern 232 on the planar surface of code wheel 230, rather than through a nominal position in first encoder pattern 232.

In this case, the duty of pulses reported out of first optical encoder 210 in one or more output signals reflects a revolution of less than 180° because it is reading information at an inner edge of first encoder pattern 232. At this time, second optical encoder 220 will report the magnitude of the eccentricity movement of code wheel 230 based on how many annular rings of second encoder pattern 234 it has moved inward from its initial reading. That is, if second optical encoder 220 is initially reading the central annular ring of second encoder pattern 234, then due to the eccentric movement of shaft 250 and code wheel 230 it will start to read a different angular ring that is inside the central annular ring. In that case, second optical encoder 220 will report an eccentric movement of −1, −2, etc. depending on which annular ring it reads, which in turn depends on the magnitude of the eccentricity of the movement of code wheel 230.

The information from second optical encoder 220 can be used to correct for a duty cycle error of first optical encoder 210. Correction can be done using the simple interpolation method described above.

In one embodiment, self duty error correcting motion encoder set 200 outputs an alarm or other signal indicating the need for maintenance, whenever the eccentric movement of code wheel 230 detected by second optical encoder 220 exceeds a preset threshold. This reduces the need for scheduled, periodic, preventative maintenance of the motion encoder set which in turn reduces down-time and operating costs for an apparatus or system that incorporates self duty error correcting motion encoder set 200.

Figure 6:
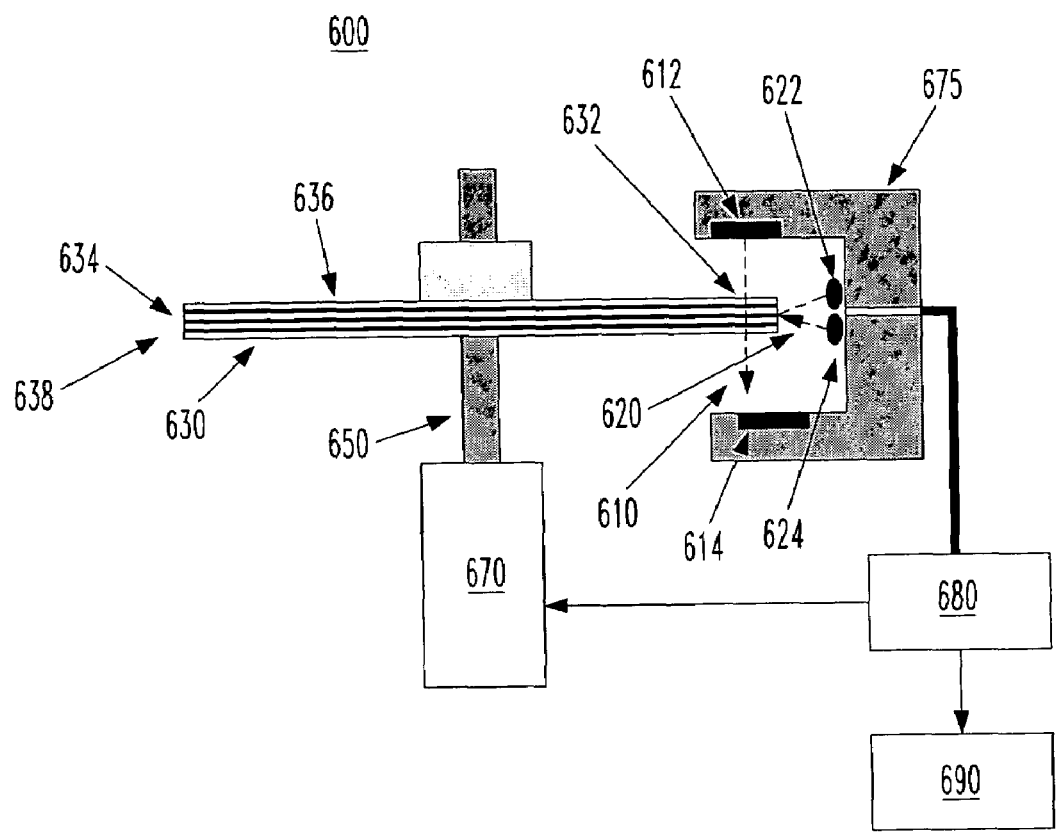
FIG. 6 shows one embodiment of a motion encoder set with up/down code wheel movement detection.

FIG. 6 shows one embodiment of a motion encoder set 600 with up/down code wheel movement detection, comprising: a first optical encoder 610 including a first light emitter 612 and a first optical sensor 614; a second optical encoder 620 including a second light emitter 622 and a second optical sensor 624; a housing 675 on which first and second optical encoders 610, 620 are mounted; a rotating shaft 650; a code wheel 630 mounted on shaft 650, the code wheel 630 including a first encoder pattern 632 on a planar surface 636 thereof, disposed between first light emitter 612 and first optical sensor 614, and a second encoder pattern 634 disposed on an outer peripheral surface 638 ("thickness") thereof; a motor controller 670 for turning shaft 650; a processor 680; and an alarm indicator 690. Code wheel 630 rotates along with shaft 650, thereby moving first encoder pattern 632 relative to first optical encoder 610, and second encoder pattern 634 relative to second optical encoder 620.

In the embodiment shown in FIGS. 6-11, for the sake of simplifying the explanation, code wheel 630 is shown comprising a single disk, with first encoder pattern 632 and second encoder pattern 634 disposed thereon. However, it should be understood that code wheel 630 could optionally comprise two or more separate disks rotating on the rotating shaft 650, with first encoder pattern 232 disposed on one disk, and second encoder pattern 234 disposed on a different, separate, disk.

Furthermore, in the embodiment shown in FIGS. 6-11, for the sake of simplifying the explanation, first and second optical encoders 610, 620 are shown mounted on common housing 675. However, it should be understood that first and second optical encoders 610, 620 can be packaged separately, being mounted on two separate housings 675.

In similarity to first motion detector 210 of self duty error correcting motion encoder set 200, first optical encoder 610 operates in conjunction with first encoder pattern 632 to measure a rotational movement of code wheel 630 and to output one or more signals indicating the rotational movement of code wheel 630. That is, first motion detector 610 outputs one or more signals having first coding information indicating a rotational speed of shaft 650 on which code wheel 630 is mounted. In contrast, second optical encoder 620 operates in conjunction with second encoder pattern 634 to measure an up/down movement of outer peripheral surface 638 of code wheel 630 and to output one or more signals indicating the up/down movement and/or wobbling movement of code wheel 630.

In the embodiment of FIG. 6, first optical encoder 610 operates in a transmissive mode by detecting light passed through first encoder pattern 632 of code wheel 630. However, in another embodiment, first light emitter 612 and first optical sensor 614 could be disposed on the same side of code wheel 630 as each other, such that first optical encoder 610 operates in a reflective mode by detecting light reflected from first encoder pattern 632 of code wheel 630.

Figure 7:
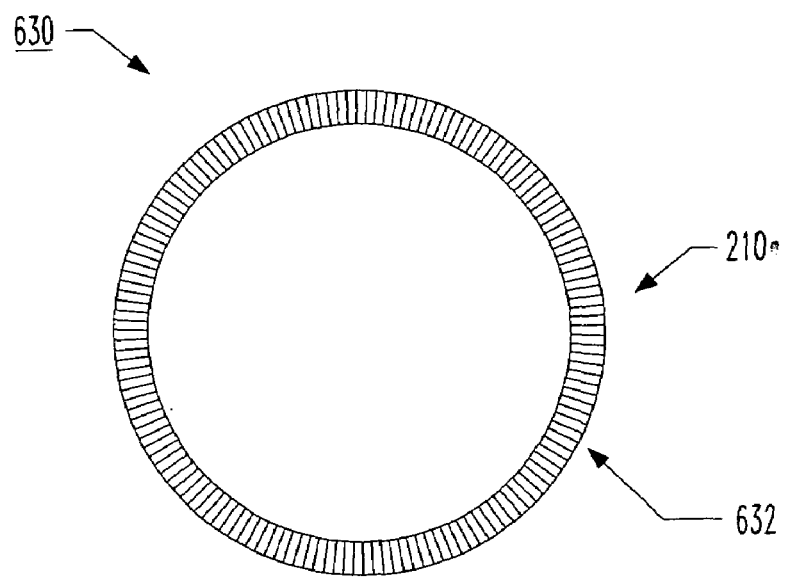
FIG. 7 shows a bottom view of a code wheel of a motion encoder set with up/down code wheel movement detection.
Figure 8:
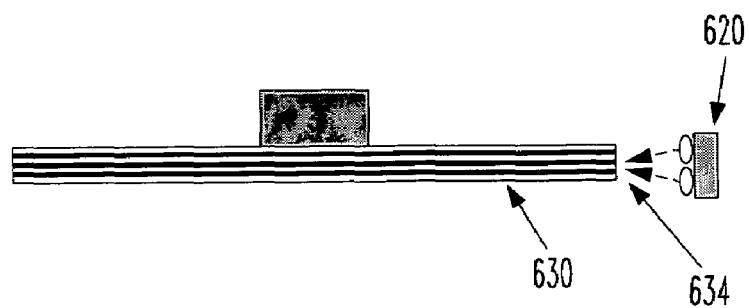
FIG. 8 illustrates a side view of a code wheel of an optical encoder set with up/down code wheel movement detection when the code wheel is in a normal position.

FIG. 7 shows a bottom view of one embodiment of code wheel 630, and FIG. 8 illustrates a side view of one embodiment of code wheel 630 of motion encoder set 600 with up/down code wheel movement detection when code wheel 630 is in a nominal position with respect to second optical encoder 620. As shown in FIG. 7, code wheel 630 comprises a single disk and includes first encoder pattern 632 on a planar surface thereof. Meanwhile, as can be more easily seen in FIG. 8, code wheel 630 also includes second encoder pattern 634 on outer peripheral surface 638 ("thickness") thereof. In the embodiment of FIG. 7, first encoder pattern 632 is a transmissive encoder pattern, and second encoder pattern 634 is a reflective pattern. First encoder pattern 632 codes information for rotation motion detection, and second encoder pattern 634 codes information for up/down and/or wobbling motion detection.

In the embodiment of FIG. 7, first encoder pattern 632 is an A/B pattern having alternating areas of differing optical transmissivity or reflectivity, depending on the design of first optical encoder 610. Optical sensor 614 detects the rate of change between the A and B patterns and thereby ascertains the relative rotational movement between first optical encoder 610 and encoder pattern 632.

Meanwhile, in the embodiment of FIG. 7, second encoder pattern 634 is an alternating pattern of annular rings of differing optical reflectivity disposed on the outer peripheral surface 638 of code wheel 630. Initially, in a nominal position as shown in FIG. 8, optical sensor 624 follows a middle or central annular ring of second encoder pattern 634. Optical sensor 624 follows a different annular ring of second encoder pattern 634 depending upon the relative up-and-down position of outer peripheral surface 638 of code wheel 630 with respect to second optical encoder 620, for example due to up/down motion and/or wobbling motion of code wheel 630 and shaft 650.

Figure 9:
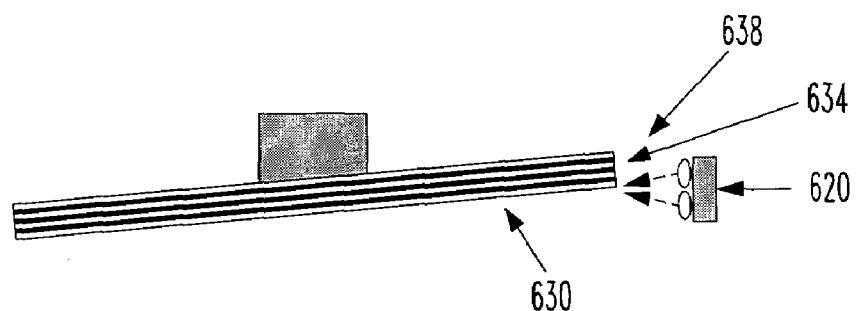
FIG. 9 illustrates a side view of a code wheel of an optical encoder set with up/down code wheel movement detection when the code wheel is tilted upward.
Figure 10:
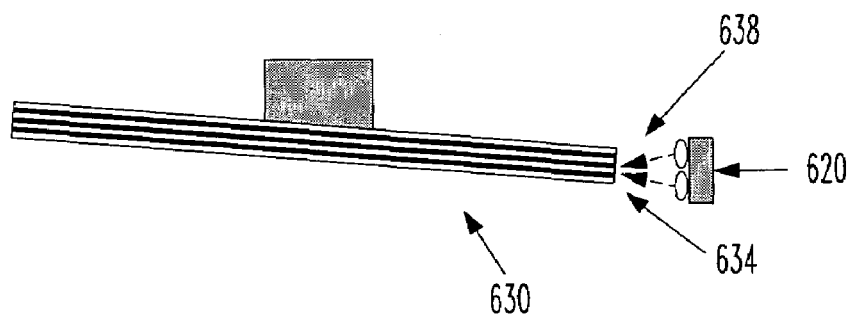
FIG. 10 illustrates a side view of a code wheel of an optical encoder set with up/down code wheel movement detection when the code wheel is tilted downward.
Figure 11:
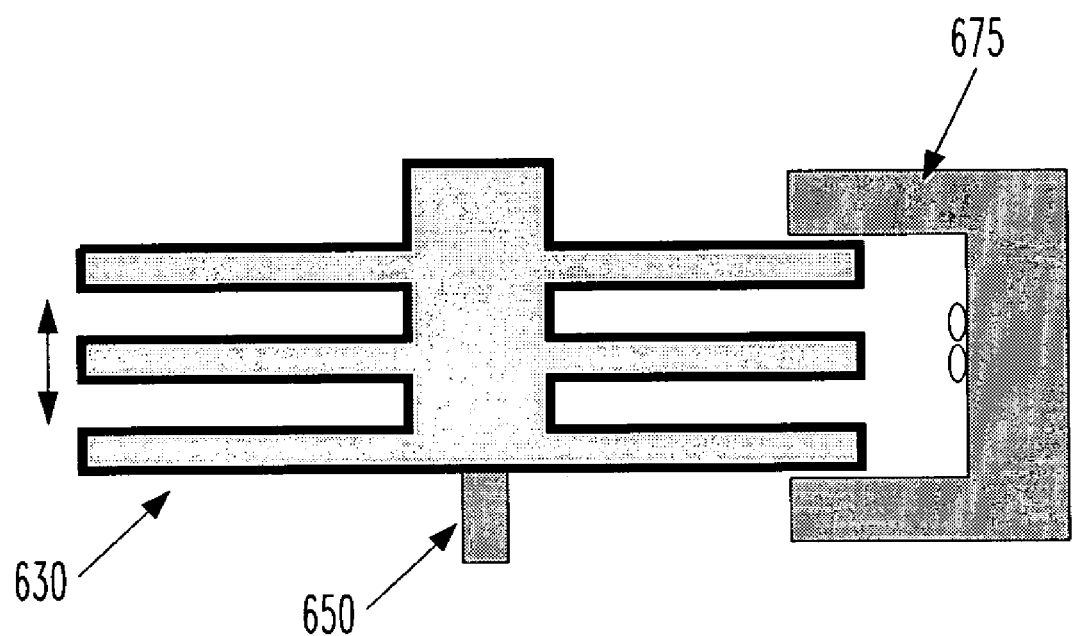
FIG. 11 illustrates up/down movement of a code wheel in an optical encoder set with up/down code wheel movement detection.

An explanation of the operation of motion encoder set 600 with up/down and/or wobbling code wheel movement detection will now be provided with reference to FIGS. 9-11.

FIG. 9 illustrates a side view of code wheel 630 of motion encoder set 600 with up/down code wheel movement detection when code wheel 630 is tilted upward, for example due to a wobbling movement of shaft 650 and code wheel 630. As noted above, second optical encoder 620 initially follows a central or middle annular ring of second encoder pattern 634. However, as outer peripheral surface 638 of code wheel 630 tilts upward, second optical encoder 620 begins to follow a lower annular ring of second encoder pattern 634 on outer peripheral surface 638. Since second encoder 620 encounters a change in the position of the annular ring of second encoder pattern 634 that it is following, it will report a changed magnitude accordingly, as +1, +2, etc. depending on the magnitude of the tilt or up-down movement of code wheel 630, and the resolution of the second encoder pattern 634.

Meanwhile, FIG. 10 illustrates a side view of code wheel 630 of motion encoder set 600 with up/down code wheel movement detection in an opposite case when code wheel 630 is tilted downward, for example due to a wobbling movement of shaft 650 and code wheel 630. With outer peripheral surface 638 of code wheel 630 tilted downward, second optical encoder 620 begins to follow a higher, or upper, annular ring of second encoder pattern 634 on outer peripheral surface 638. Since second optical encoder 620 encounters a change in the position of the annular ring of second encoder pattern 634 that it is following, it will report a changed magnitude. Since the movement is opposite to the direction discussed above with respect to FIG. 9, it will report the magnitude with an opposite sign now, e.g., as −1, −2, etc. depending on the magnitude of the tilt or up-down movement of code wheel 630, and the resolution of the second encoder pattern 634.

Whenever the wobbling movement of code wheel 630 detected by second optical encoder 620 exceeds a preset threshold, second optical encoder 620 outputs one or more signals that indicate a wobbling movement of code wheel 630, thus monitoring for such a problem. The signal(s) output by second optical encoder 620 are provided to processor 680 where they can be used to generate an alarm or other signal to be sent to alarm 690, indicating the need for maintenance, whenever the wobbling movement of code wheel 630 detected by second optical encoder 620 exceeds a preset threshold. This reduces the need for scheduled, periodic, preventative maintenance which in turn reduces down-time and operating costs for an apparatus or system that incorporates motion encoder set 600.

FIG. 11 illustrates up/down movement of code wheel 630 of optical encoder set 600 with up/down code wheel movement detection. Here, code wheel 630 is mounted on a worn out shaft 650 which has an undesired up/down movement with housing 675. Since code wheel 630 is mounted on shaft 650, code wheel 630 will also be moving up and down within housing 675. If the up and down movement is too great, code wheel 630 may rub against, or collide with, housing 675, whereby motion encoder set 600 may provide inaccurate signals which may impair operation of a host apparatus with which motion encoder set 600 is incorporated, or perhaps even damaging the host apparatus, and/or eventually damaging motion encoder set 600 itself.

However, second optical encoder 620 outputs one or more signals that indicates an up/down movement of code wheel 630, thus monitoring for such a problem. The signal(s) output by second optical encoder 620 are provided to processor 680 where they can be used to generate an alarm or other signal to be sent to alarm 690, indicating the need for maintenance, whenever the up/down movement of code wheel 630 detected by second optical encoder 620 exceeds a preset threshold. This reduces the need for scheduled, periodic, preventative maintenance which in turn reduces down-time and operating costs for an apparatus or system that incorporates motion encoder set 600. Also, in a case where motor controller 670 includes an up/down movement control, processor 680 may generate an appropriate signal to be applied to motor controller 670 to reduce or minimize the net up/down movement of code wheel 630 and shaft 650.

In another embodiment, a motion encoder set includes first, second, and third optical encoders, where the first optical encoder measures rotational movement of the code wheel, the second optical encoder measures eccentric movement (e.g., waggling) of the code wheel like the optical encoder 220 described above, and the third optical encoder measures up/down movement of the code wheel like the optical encoder 620 described above. In that case, the code wheel includes first, second, and third encoder patterns. Once again, the code wheel may include one or more disks, and the encoder patterns can be conveniently provided on the same disk, or two or three different disks. Where a single disk is used, first and second encoder patterns are provided on one or more planar surfaces thereof, and third encoder pattern is provided on the outer peripheral surface thereof. An alarm signal indicating a need for repair can be generated in response to the outputs of either or both of the second and third optical encoders.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A motion encoder set, comprising:
   a code wheel, including, provided thereon,
      a first encoder pattern, and
      a second encoder pattern;
   a first optical encoder, including,
      a first light source adapted to provide light to the first encoder pattern, and
      a first optical sensor adapted to receive the light from the first encoder pattern and in response thereto to output one or more signals indicating a rotational movement of the code wheel; and
   a second optical encoder, including,
      a second light source adapted to provide light to the second encoder pattern, and
      a second optical sensor adapted to receive the light from the second encoder pattern and in response thereto to output one or more signals indicating an up/down movement of the code wheel in a direction parallel to an axis of rotation of the code wheel.

2. The motion encoder set of claim 1, wherein the code wheel comprises a single disk, wherein the first encoder pattern is provided on at least one planar surface of the disk, and the second encoder pattern is provided on an outer peripheral surface of the disk.

3. The motion encoder set of claim 1, wherein the code wheel comprises at least two separate disks and wherein the first encoder pattern is provided on a first one of the disks and the second encoder pattern is provided on a second one of the disks.

4. The motion encoder set of claim 1, wherein the code wheel comprises a single disk and the first and second encoder patterns are both provided on that single disk.

5. The motion encoder set of claim 1, wherein the first optical encoder is a transmissive optical encoder, wherein the first light source and the first optical sensor are disposed on opposite sides of the code wheel.

6. The motion encoder set of claim 5, wherein the second optical encoder is a reflective optical encoder, wherein the second light source and the second optical sensor are disposed opposite an outer peripheral surface of the code wheel.

7. The motion encoder set of claim 1, wherein the first optical encoder is a reflective optical encoder, wherein the first light source and the first optical sensor are disposed on a same side of the code wheel as each other.

8. The motion encoder set of claim 1, further comprising a processor adapted to receive the one or more signals output by the second optical sensor, wherein the processor outputs a signal indicating a need for maintenance of the motion encoder set, in response to the one or signals output by the second optical sensor indicating that the up/down movement of the code wheel exceeds a threshold.

9. A method of determining a motion of a code wheel, comprising:
   providing light to a first encoder pattern provided on the code wheel;
   receiving the light from the first encoder pattern and in response thereto outputting one or more signals indicating a rotational movement of the code wheel;
   providing light to a second encoder pattern provided on the code wheel; and
   receiving the light from the second encoder pattern and in response thereto outputting one or more signals indicating an up/down movement of the code wheel in a direction parallel to an axis of rotation of the code wheel.

10. The method of claim 9, further comprising outputting a signal indicating a need for maintenance, in response to the one or signals indicating a non-rotational movement of the code wheel exceeding a threshold.

11. The method of claim 9, wherein providing light to a second encoder pattern provided on the code wheel includes providing light onto the second encoder pattern disposed on an outer peripheral surface of the code wheel.

* * * * *